United States Patent
Chang et al.

(10) Patent No.: US 7,655,870 B2
(45) Date of Patent: *Feb. 2, 2010

(54) PRINTED CIRCUIT BOARD ABLE TO SUPPRESS SIMULTANEOUS SWITCHING NOISE

(75) Inventors: Liang-Yao Chang, Taipei Hsien (TW); Shou-Kuo Hsu, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

This patent is subject to a terminal disclaimer.

(21) Appl. No.: 11/829,972

(22) Filed: Jul. 30, 2007

(65) Prior Publication Data
US 2008/0115964 A1 May 22, 2008

(30) Foreign Application Priority Data
Nov. 17, 2006 (CN) .................... 2006 1 0156899

(51) Int. Cl.
*H05K 1/03* (2006.01)

(52) U.S. Cl. ..................................... 174/255; 174/262
(58) Field of Classification Search ............... 174/255, 174/260, 261, 262; 361/792, 793, 794, 795
See application file for complete search history.

(56) References Cited

U.S. PATENT DOCUMENTS

| 5,764,491 A * | 6/1998 | Tran ............................ 361/794 |
| 6,564,355 B1 | 5/2003 | Smith et al. |
| 6,624,729 B2 * | 9/2003 | Wright et al. ............... 333/238 |
| 7,068,518 B2 * | 6/2006 | Ueno et al. .................. 361/760 |
| 2008/0099231 A1* | 5/2008 | Chang et al. ................ 174/256 |

* cited by examiner

*Primary Examiner*—Ishwar (I. B.) Patel
(74) *Attorney, Agent, or Firm*—Frank R. Niranjan

(57) ABSTRACT

An exemplary printed circuit board includes a power plane, and a ground plane. The power plane includes two power modules, and an insulating medium for insulating the two power modules from each other. The ground plane is insulated from the power plane, a plurality of slots is defined in the ground plane and located close to facing edges of the two power modules, and the slots are arranged in rows along the facing edges of the two power modules.

7 Claims, 5 Drawing Sheets

PRINTED CIRCUIT BOARD ABLE TO SUPPRESS SIMULTANEOUS SWITCHING NOISE

BACKGROUND OF THE INVENTION

1. Field of the Invention

The present invention relates to printed circuit boards, and particularly to suppression of simultaneous switching noise (SSN) in a printed circuit board (PCB).

2. Description of Related Art

As the density of integrated circuits on PCBs increases, the problems associated with signal switching noise become greater. Many integrated circuits have a large number of input/output (I/O) drivers. Several hundred drivers may be present in integrated circuits, and this number will undoubtedly become greater as packaging density increases in the future. Noise that occurs in the PCB when a large number of drivers simultaneously switch from one state to another is known as SSN. The problem may be even more acute when the drivers all switch in the same direction (e.g. high to low). When a large number of drivers switch simultaneously, various signal integrity problems may occur. For example, a conventional PCB as shown in FIG. 4 includes a ground plane 100, a power plane 200 insulated from the ground plane 100 by a fiberglass material, and two integrated circuits A, B positioned on a surface plane (not shown) of the PCB. The power plane 200 includes two power modules 210, 220 insulated from each other by an insulating medium 230 made up of fiberglass material to respectively provide power supply for the integrated circuits A, B. When drivers in the integrated circuit A simultaneously switch from one state to another, SSN from the integrated circuit A can be transmitted to the power module 220 via the power module 210 and an equivalent coupling capacitance formed by the power modules 210, 220 and the insulating medium 230. Then the integrated circuit B may receive the SSN and cause incorrect actions.

What is needed, therefore, is a PCB with suppressed SSN therein.

SUMMARY OF THE INVENTION

An exemplary printed circuit board includes a power plane, and a ground plane. The power plane includes two power modules, and an insulating medium for insulating the two power modules from each other. The ground plane is insulated from the power plane, a plurality of slots is defined in the ground plane and located close to facing edges of the two power modules, and the slots are arranged in a row along the facing edges of the two power modules.

Other advantages and novel features will become more apparent from the following detailed description when taken in conjunction with the accompanying drawings, in which:

DETAILED DESCRIPTION OF THE INVENTION

Figure 1:
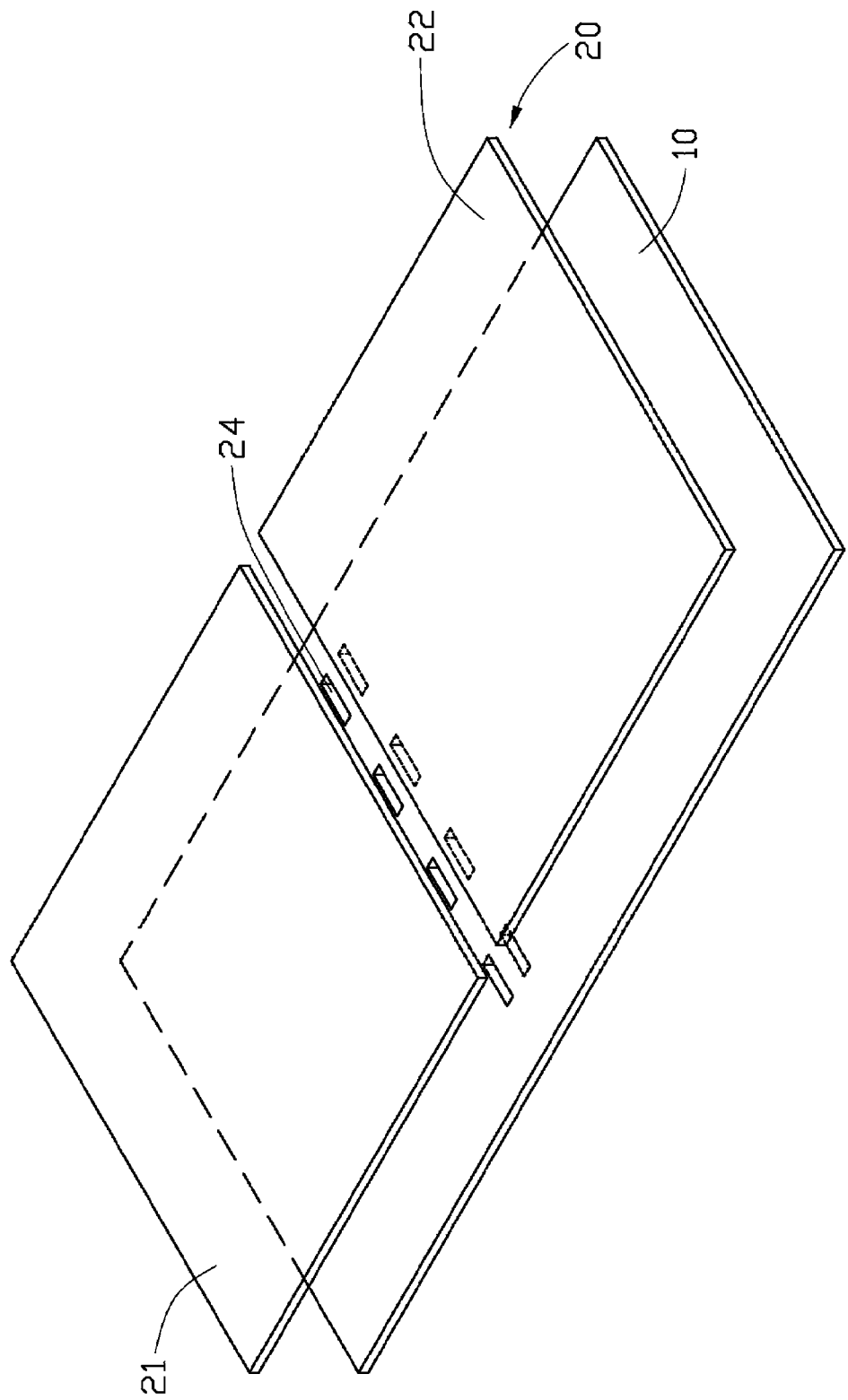
FIG. 1 is an isometric, schematic diagram of a printed circuit board in accordance with an embodiment of the present invention.
Figure 2:
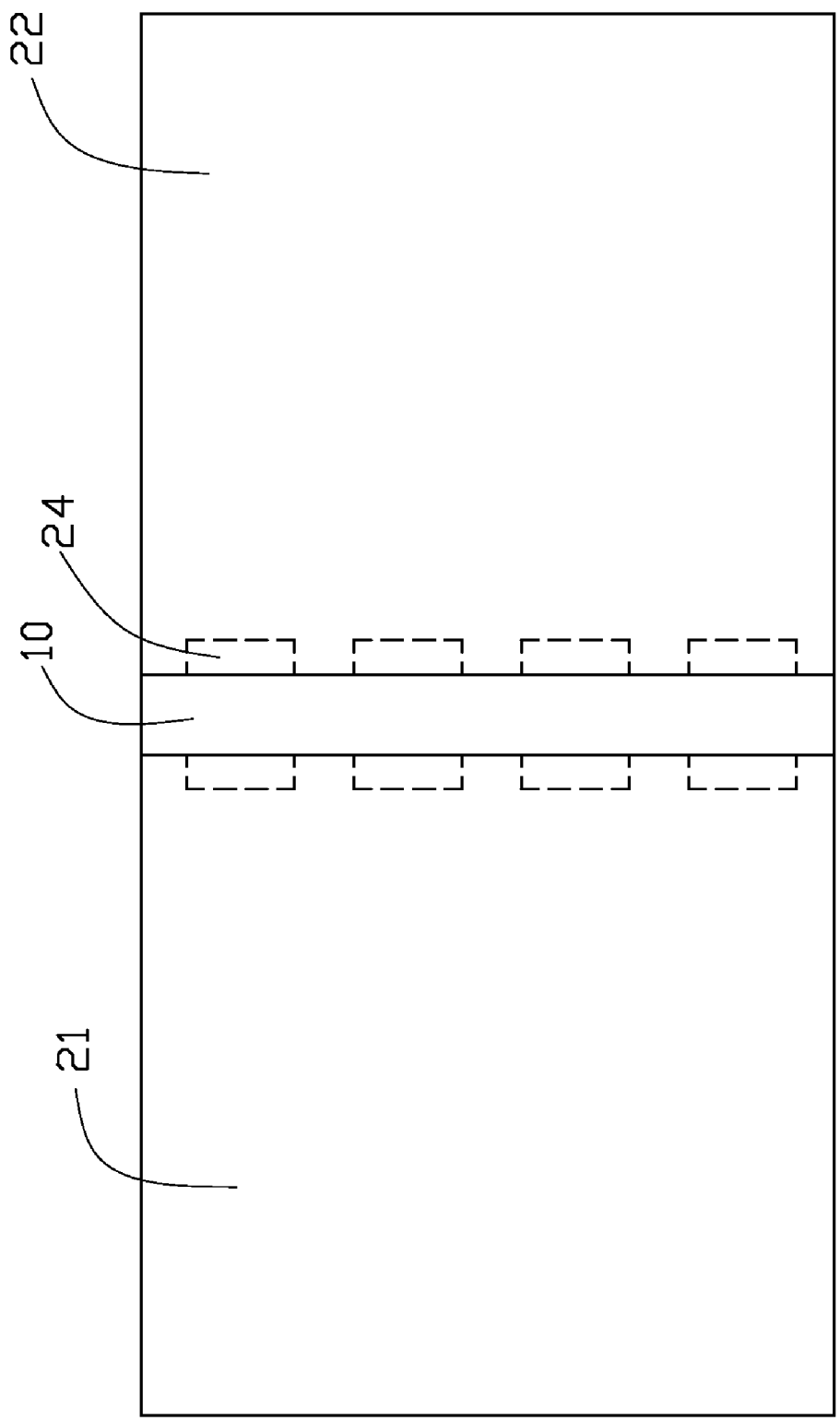
FIG. 2 a top plane view of FIG. 1.

Referring to FIG. 1 and FIG. 2, a printed circuit board (PCB) in accordance with an embodiment of the present invention includes a ground plane 10, and a power plane 20. The power plane 20 includes two power modules 21, 22 for respectively providing power for two electronic components (not shown), and insulating mediums (not shown) disposed between the power modules 21 and 22 for insulating the power module 21 from the power module 22. The ground plane 10 is insulated from the power plane 20 by fiberglass material (not shown). The insulating mediums are made up of fiberglass. A plurality of through slots 24 is defined in the ground plane 10 and located close to two facing edges of the power modules 21 and 22, which are adjacent the insulating mediums. Preferably, the slots 24 are arranged in two rows respectively along the facing edges of the power modules 21 and 22. The ground plane 10 provides a path for the signal and noise, and the slots 24 defined in the ground plane 10 form equivalent coupling inductances. When drivers in one of the electronic components simultaneously switch from one state to another, simultaneous switching noise (SSN) transmitted from the power module 21 to the power module 22, or the SSN transmitted from the power module 22 to the power module 21 can be filtered by the equivalent coupling inductances. Therefore, the SSN in the PCB is suppressed.

In this embodiment, two rows of slots 24 are defined in the ground plane 10. A same edge of each slot 24 superposes either one of the two facing edges of the power modules 21 and 22, and each slot 24 is beneath either one of the power modules 21 and 22. The number of the rows of the slots 24 can be altered.

Figure 3:
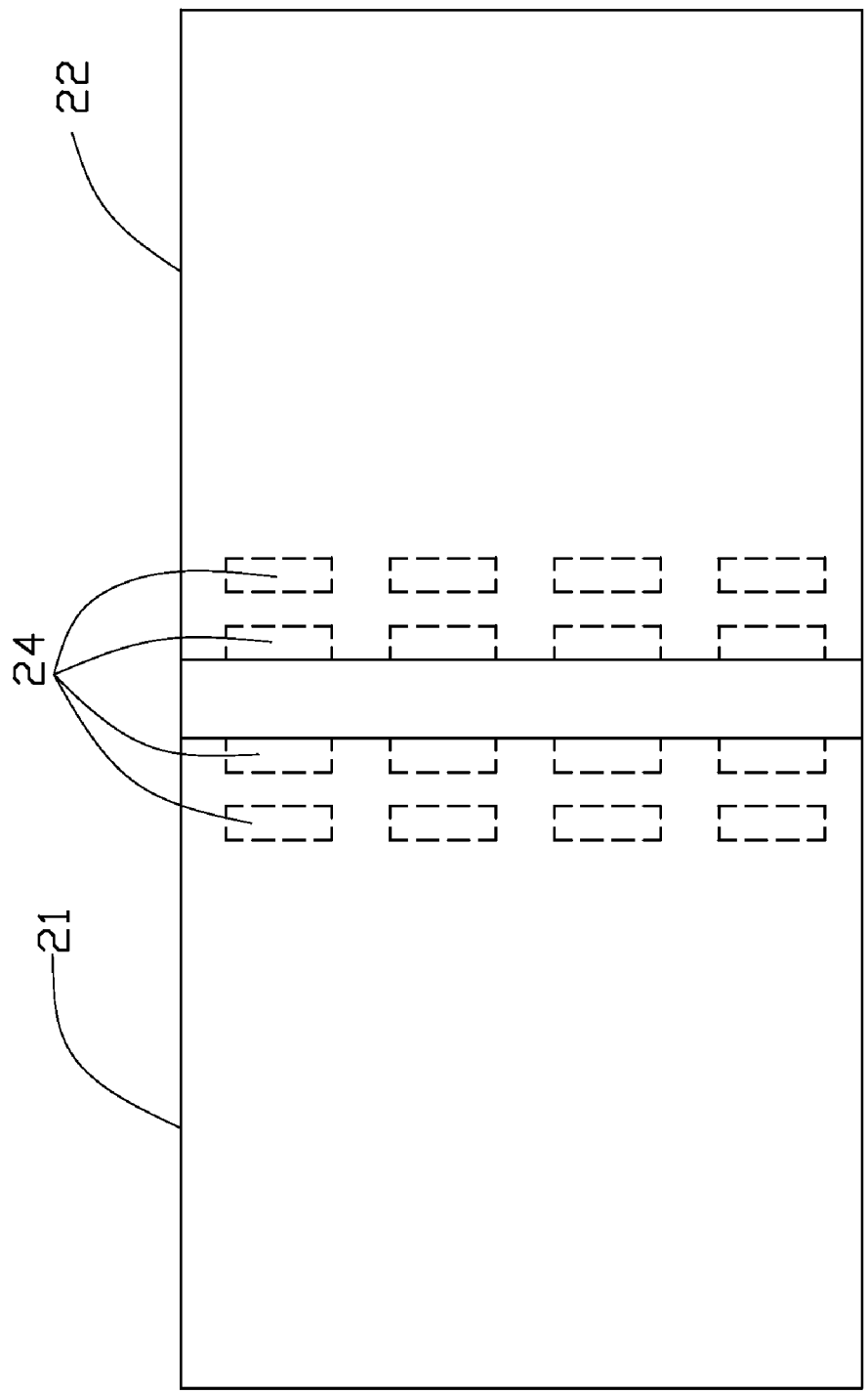
FIG. 3 is an isometric, schematic diagram of a printed circuit board in accordance with another embodiment of the present invention.

Referring to FIG. 3, a PCB in accordance with another embodiment of the present invention is shown. The difference between FIG. 1 and FIG. 3 is that four rows of slots 24 are defined in the ground plane 10 with two rows defined under the power module 21, and the other two rows defined under the power module 22.

Figure 4:
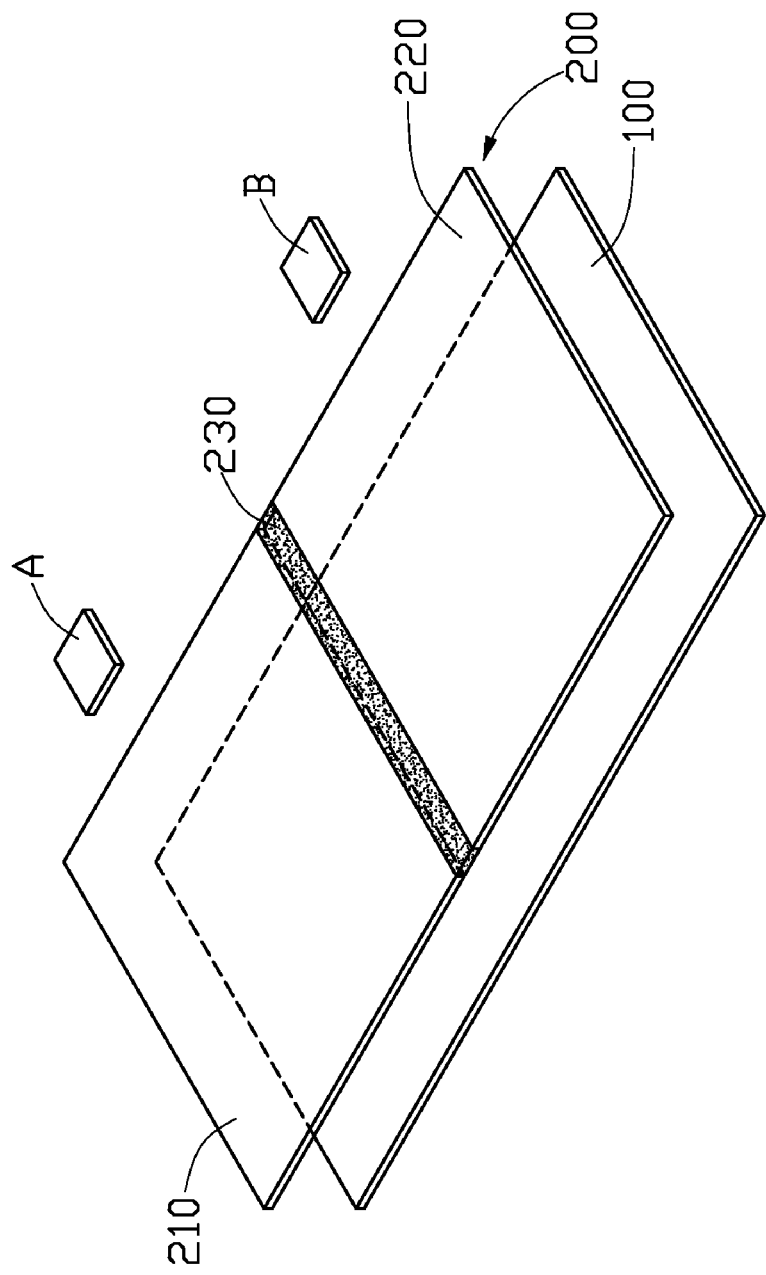
FIG. 4 is a schematic diagram of a conventional printed circuit board.
Figure 5:
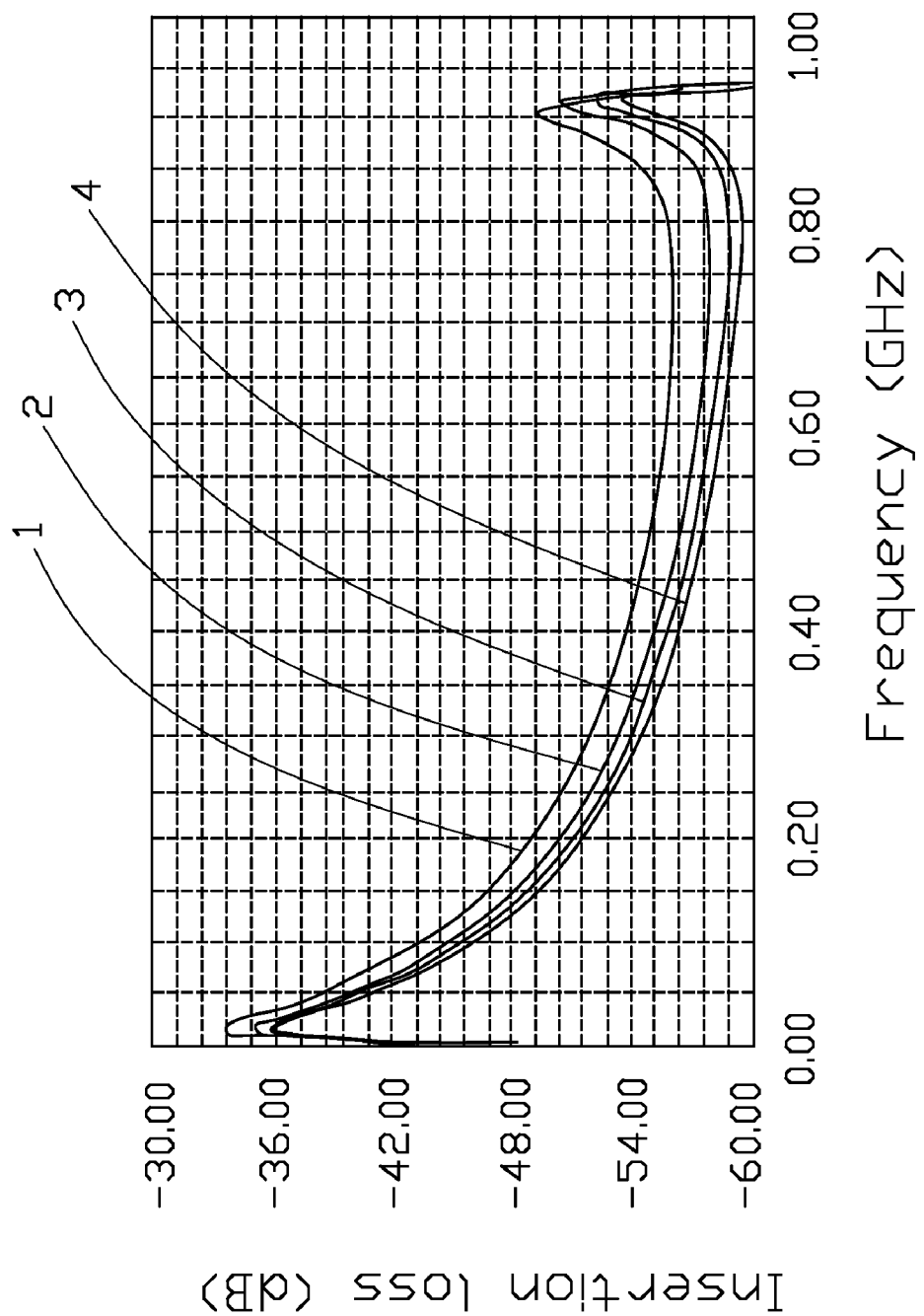
FIG. 5 is a graph of insertion loss versus frequency in the PCBs of FIGS. 1, 3, and 4.

FIG. 5 shows a graph comparing insertion loss versus frequency in the PCBs of FIGS. 1, 3, and 4. Curves c2, c3, c1 are respective insertion loss versus frequency curves of the PCBs of FIGS. 1, 3, and 4, curve c4 is insertion loss versus frequency curve of a PCB with ten rows of slots 24 defined in the ground, five rows are defined under the power module 21, and the other five rows are defined under the power module 22. The curves c2 and c3 show the insertion loss of the PCBs of FIGS. 1 and 3 are less than the insertion loss of the PCB of FIG. 4 when the frequency is less than 0.9 GHz. Less insertion loss indicates a better effect of blocking the SSN. The curves c2, c3, and c4 show the insertion loss of the PCBs is less when there are more rows of slots 24. The more rows, the better the effect of blocking the SSN.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A printed circuit board comprising:
a power plane comprising two spaced power modules disposed side by side, and an insulating medium arranged between two facing edges of the power modules for insulating the two power modules from each other; and
a ground plane insulated from the power plane, a plurality of slots being defined in the ground plane and located close to the two facing edges of the power modules, and the slots being arranged in at least two rows along the two facing edges of the power modules respectively to form equivalent coupling inductances which filter simultaneous switching noise transmitted from one of the power modules to the other.

2. The printed circuit board as claimed in claim 1, wherein the insulating medium is made up of fiberglass material.

3. The printed circuit board as claimed in claim 1, wherein the slots are arranged in at least two rows of slots close to each of the two facing edges of the power modules.

4. The printed circuit board as claimed in claim 1, wherein a same edge of each slot superposes either one of the two facing edges of the power modules.

5. A printed circuit board comprising:
a power plane comprising two power modules each having a facing edge facing the other, and an insulating medium disposed between the facing edges of the power modules for insulating the two power modules from each other;
a ground plane positioned under the two power modules; and
at least two rows of slots defined in the ground plane positioned under the facing edges of the two power modules to form equivalent coupling inductances which filter simultaneous switching noise transmitted from one of the power modules to the other.

6. The printed circuit board as claimed in claim 5, wherein the at least two rows of slots comprise two rows of slots positioned along two projective lines of the facing edges on the ground plane respectively and another two rows of slots parallel to and spaced from the two rows of slots.

7. A printed circuit board comprising:
a power plane comprising two power modules each having a facing edge facing the other, and an insulating medium disposed between the facing edges of the power modules for insulating the two power modules from each other; and
a ground plane positioned under and insulated from the power plane, at least one row of slots defined in the ground plane positioned along a projective line of one of the facing edges on the ground plane to form equivalent coupling inductances which filter simultaneous switching noise transmitted from one of the power modules to the other.

* * * * *